(12) United States Patent
Hill et al.

(10) Patent No.: US 8,933,934 B1
(45) Date of Patent: Jan. 13, 2015

(54) SYSTEM AND METHOD FOR ASSURING THE PROPER OPERATION OF A PROGRAMMABLE GRAPHICS PROCESSING UNIT

(75) Inventors: Nathan W. Hill, Sandy, UT (US); Travis S. Vanderkamp, Marion, IA (US); Victor C. Ashby, Draper, UT (US)

(73) Assignee: Rockwell Collins, Inc., cedar Rapids, IA (US)

( * ) Notice: Subject to any disclaimer, the term of this patent is extended or adjusted under 35 U.S.C. 154(b) by 809 days.

(21) Appl. No.: 13/162,845

(22) Filed: Jun. 17, 2011

(51) Int. Cl.
*G06T 15/50* (2011.01)

(52) U.S. Cl.
USPC .......................................... 345/426; 345/581

(58) Field of Classification Search
CPC ........ G06T 7/001; G06T 15/005; G06T 15/80
USPC ................................................ 345/426, 581
See application file for complete search history.

(56) References Cited

U.S. PATENT DOCUMENTS

| | | | |
|---|---|---|---|
| 2005/0243094 A1* | 11/2005 | Patel et al. | 345/506 |
| 2005/0276514 A1* | 12/2005 | Fisher | 382/286 |
| 2007/0165035 A1 | 7/2007 | Duluk | |
| 2012/0268475 A1* | 10/2012 | Hancock | 345/589 |

* cited by examiner

*Primary Examiner* — Kee M Tung
*Assistant Examiner* — Peter Hoang
(74) *Attorney, Agent, or Firm* — Angel N. Gerdzhikov; Donna P. Suchy; Daniel M. Barbieri (57) ABSTRACT

The system assures the proper operation of a programmable GPU. A list of shader programs is generated. A programmable GPU is instructed to render a set of graphic primitives to generate test image data into a test area of RAM of the GPU utilizing one of the listed programs. The GPU is instructed to combine test image data from the test area with normal image data to form a composite image as display image data. The data in the GPU RAM is output to an image processing unit (IPU), wherein the data is processed by the IPU. The IPU is utilized to apply a CRC algorithm to the test image data to calculate a check value. The calculated value is compared against a predetermined value for the test area. A fault is reported if the calculated check value does not match the predetermined value. These above steps are then repeated.

13 Claims, 6 Drawing Sheets

SYSTEM AND METHOD FOR ASSURING THE PROPER OPERATION OF A PROGRAMMABLE GRAPHICS PROCESSING UNIT

BACKGROUND OF THE INVENTION

1. Field of the Invention

The present invention relates generally to assuring the proper operation of programmable graphics devices, and more particularly to monitoring for corruption of the function of the graphics devices including critical data contained within the graphics devices.

2. Description of the Related Art

Traditional graphics devices have fixed functionality pipelines and can only perform the operations built into them. Modern 3D Commercial Off The Shelf (COTS) graphics devices are not fixed functionality. Their functionality is programmable. These programs cause the devices to function differently from program to program. There is presently no adequate manner provided in the prior art for deterministically assuring that the device is working properly. Requirements, design, and test documentation for these devices is sparse at best. These devices cannot be trusted to monitor and report internal errors. Assuring proper operation of these programmable graphics devices is problematic and a large roadblock when it comes to certifying these parts.

Modern graphics chips have multiple programmable stages that run small programs called "shaders". If shader code is corrupted or the graphics device does not operate correctly when executing the shader code then erroneous visual data might be displayed on the flight displays. Therefore the unprotected shader code and the proper operation of the graphics chips must be continuously verified to be free of corruption.

As will be disclosed below, the present invention assures proper operation of these programmable graphics devices.

SUMMARY OF THE INVENTION

In a broad aspect, the present invention is a method for assuring the proper operation of a programmable graphics processing unit (GPU). In a first step of operation a list of shader programs is generated. A programmable GPU is then instructed to render a predetermined set of graphic primitives to generate test image data into a test area of random access memory (RAM) of the GPU utilizing one of the shader programs in the list. The GPU is instructed to combine test image data from the test area with normal image data to form a composite image for output as display image data. The display image data in the GPU RAM is output to an image processing unit (IPU), wherein the display image data is processed by the IPU. The IPU is utilized to apply a cyclic redundancy check (CRC) algorithm to the test image data to calculate a check value. The calculated check value is compared against a predetermined value for the test area. A fault is reported if the calculated check value does not match the predetermined value. These above steps are then repeated.

In another broad aspect, critical data is placed in an unprotected random access memory (RAM) of a GPU. The GPU is instructed to use a portion of the unprotected GPU RAM where the critical data is stored as texture image data to be used when drawing primitives. The GPU is instructed to render at least one primitive using the texture image data into a test area of the GPU RAM. The primitive is rendered such that each element of the texture image data corresponds to at least one element of a display image data area where the primitive is rendered. The GPU is instructed to combine test image data from the test area with normal image data from a normal image area of a display image to form a composite image for output as display image data. The display image data in the GPU RAM is outputted to an image processing unit (IPU), wherein the display image data is processed by the IPU. The IPU is utilized to apply a cyclic redundancy check (CRC) algorithm to the test image data to calculate a check value. The calculated check value is compared against a predetermined value for the test area. A fault is reported if the calculated check value does not match the predetermined value. These above steps are then repeated.

In another broad aspect, the present invention is embodied as a system for assuring the proper operation of a programmable graphics processing unit (GPU), comprising: a) a central processing unit (CPU); b) a programmable graphics processing unit (GPU) operatively connected to the CPU; c) an image processing unit (IPU) operatively connected to the GPU; and, d) unprotected random access memory (RAM) operatively connected to the GPU.

The CPU is configured to instruct the GPU to render a predetermined set of graphic primitives to generate test image data into a test area of random access memory (RAM) of the GPU utilizing at least one of a plurality of shader programs in a list of generated shader programs. The CPU is configured to instruct the GPU to combine test image data from the test area with normal image data to form a composite image for output as display image data. The GPU is configured to output the display image data in the GPU RAM to the IPU, wherein the display image data is processed by the IPU. The IPU is configured to apply a cyclic redundancy check (CRC) algorithm to the test image data to calculate a check value. The CPU is configured to compare the calculated check value against a predetermined value for the test area. The CPU is configured to report a fault if the calculated check value does not match the predetermined value.

The present invention assures that commercially available graphics hardware is continuing to work properly for safety critical applications.

DETAILED DESCRIPTION OF THE INVENTION

Figure 1:
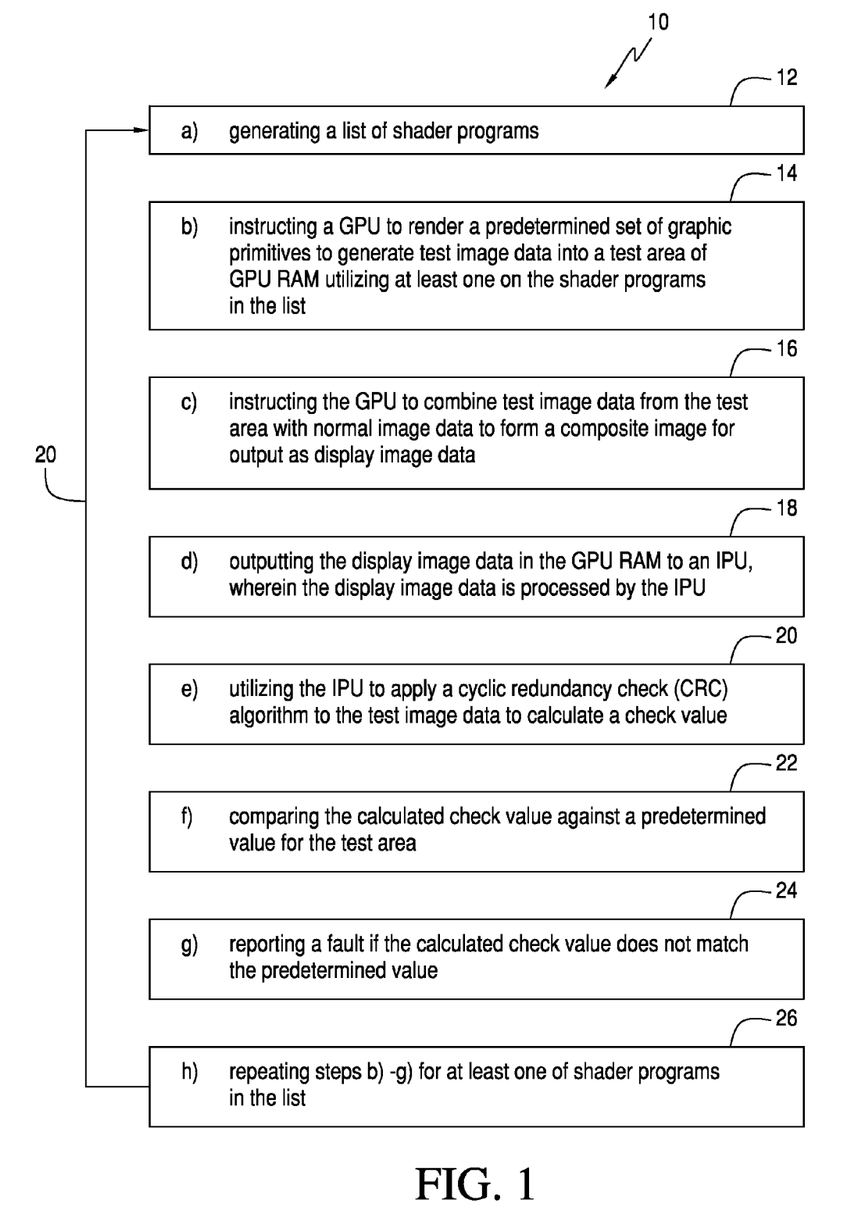
FIG. 1 is a flowchart illustrating the method of the proper operation of a programmable graphics processing unit (GPU), in accordance with the principles of the present invention.

Referring now to the drawings and the characters of reference marked thereon, FIG. 1 illustrates the method steps in implementing the system for assuring the proper operation of a programmable graphics processing unit (GPU), of the present invention, designated generally as 10.

In a first step of operation a list of shader programs is generated, as indicated by process block 12. Shader programs are a set of software instructions to be executed by the programmable GPU. There are generally two classes of shaders, vertex shaders and pixel shaders. Vertex shaders process the traits (position, texture coordinates, colors, etc.) of a vertex to be rendered. Pixel shaders describe the traits (color, z-depth, and alpha value) of a pixel to be rendered. Shaders will operate on the graphics commands and data provided to the GPU by the CPU. The shaders produce image data. Vertex and pixel shaders are known to those skilled in this field. The shader programs are generally generated, i.e. compiled, in the lab during software development. However, alternatively they may be compiled in real-time during computer runtime. Preferably, the step of generating a list of shader programs includes a substep of monitoring the operation of the GPU to limit the list of shader programs to those that have been executed by the GPU. The list of programs is limited to assure that the programs that are actually being utilized are being monitored. This enhances the efficiency of the system by only monitoring the shaders that are utilized.

A GPU is used to render a predetermined set of graphic primitives to generate test image data into a test area of GPU RAM utilizing at least one of the shader programs in the list (see process block 14). The graphic primitives may be, for example, quads, polygons, triangles, lines, and points, as is well known in this field. The test area is typically an off screen portion of the display image data. The test image data are the rendered primitives.

The GPU is instructed to combine test image data from the test area with normal image data to form a composite image for output as display image data (see process block 16). The display image data may be, for example, a portion of the GPU RAM where the primitives are rendered.

The display image data in the GPU RAM is outputted to an image processing unit (IPU) and the display image data is processed by the IPU (see process block 18).

The IPU is utilized to apply a cyclic redundancy check (CRC) algorithm to the test image data to calculate a check value (see process block 20). The CRC is a mechanism for validating the test image data. Other mechanisms can be utilized such as a check sum, pixel compare, etc.

The calculated check value is compared against a predetermined value for the test area (see process block 22). If they are the same it is highly probable that the GPU is functioning correctly.

A fault is reported if the calculated check value does not match the predetermined value (see process block 24). These above steps are repeated for at least one of the shader programs in the list, as indicated by process block 26 and line 28.

Figure 2:
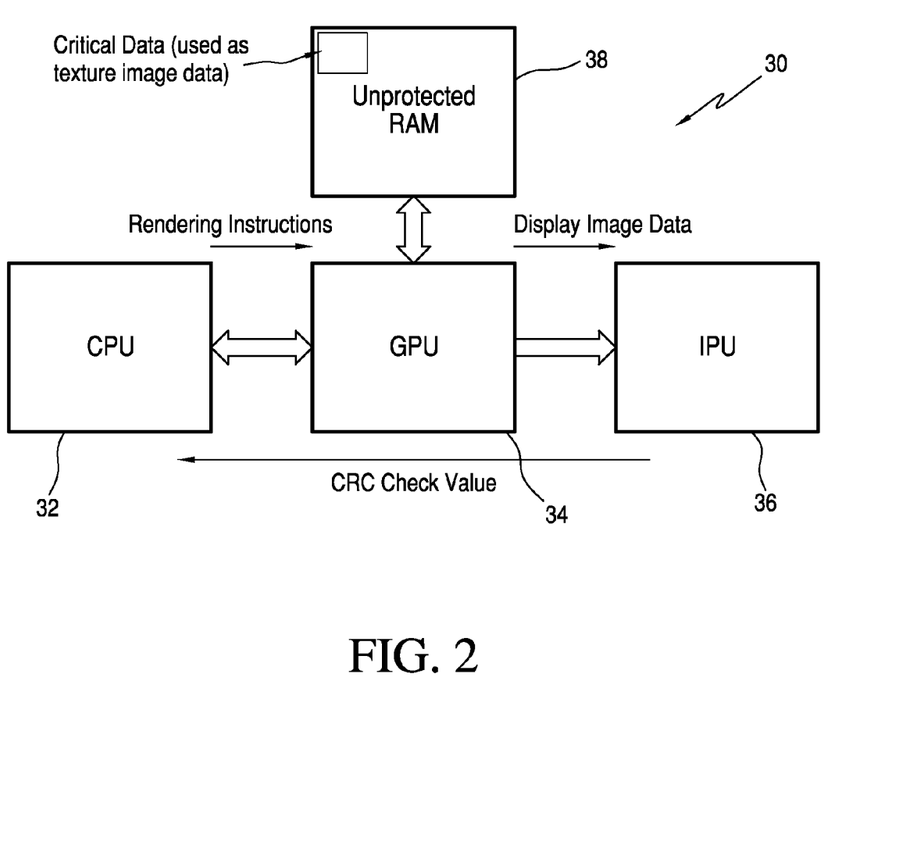
FIG. 2 is a system block diagram of the system of the present invention.

This process can be used for the monitoring and validation of critical data. Referring now to FIG. 2, a preferred implementation of the present invention is illustrated, designated generally as 30. The system 30 for assuring the proper operation of a programmable graphics processing unit (GPU), includes a central processing unit (CPU) 32; a programmable graphics processing unit (GPU) 34 operatively connected to the CPU 32; an image processing unit (IPU) 36 operatively connected to the GPU 34; and, unprotected random access memory (RAM) 38 operatively connected to the GPU 34, configured to store received critical data. As the term is used herein "critical data" in the context of an aircraft application refers to data that contributes to the drawing of symbols on the display that will provide the pilot with information used to fly the plane. This is generally most (if not all) of the data sent.

Figure 3A:
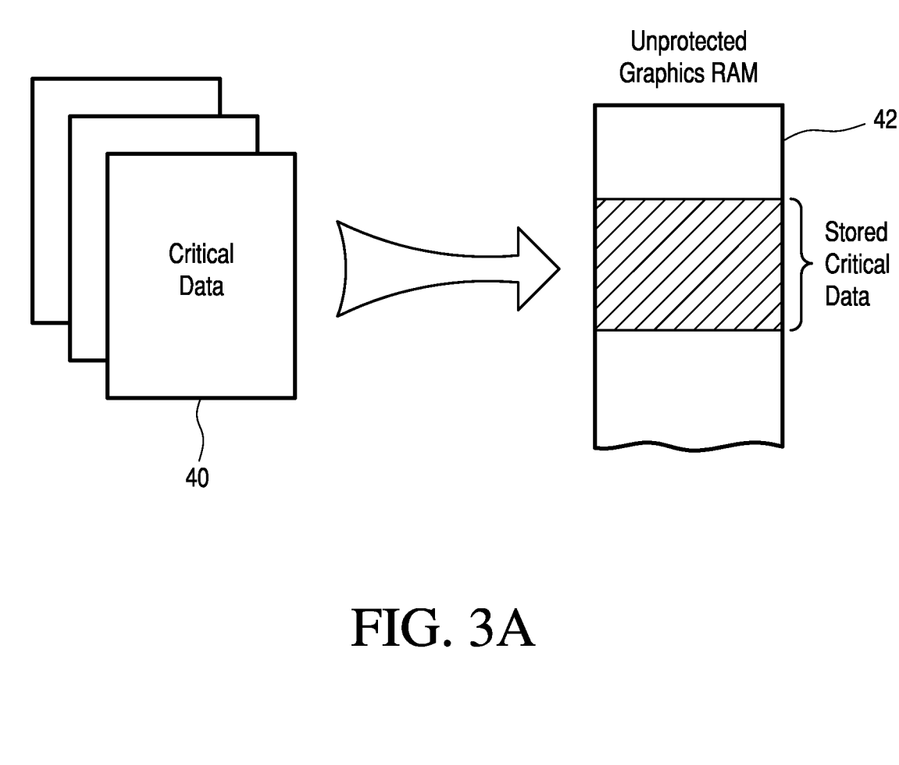
FIG. 3 is an illustration of the sequence of steps using the method of FIG. 1, where critical data existing in an unprotected random access memory is validated.
Figure 3B:
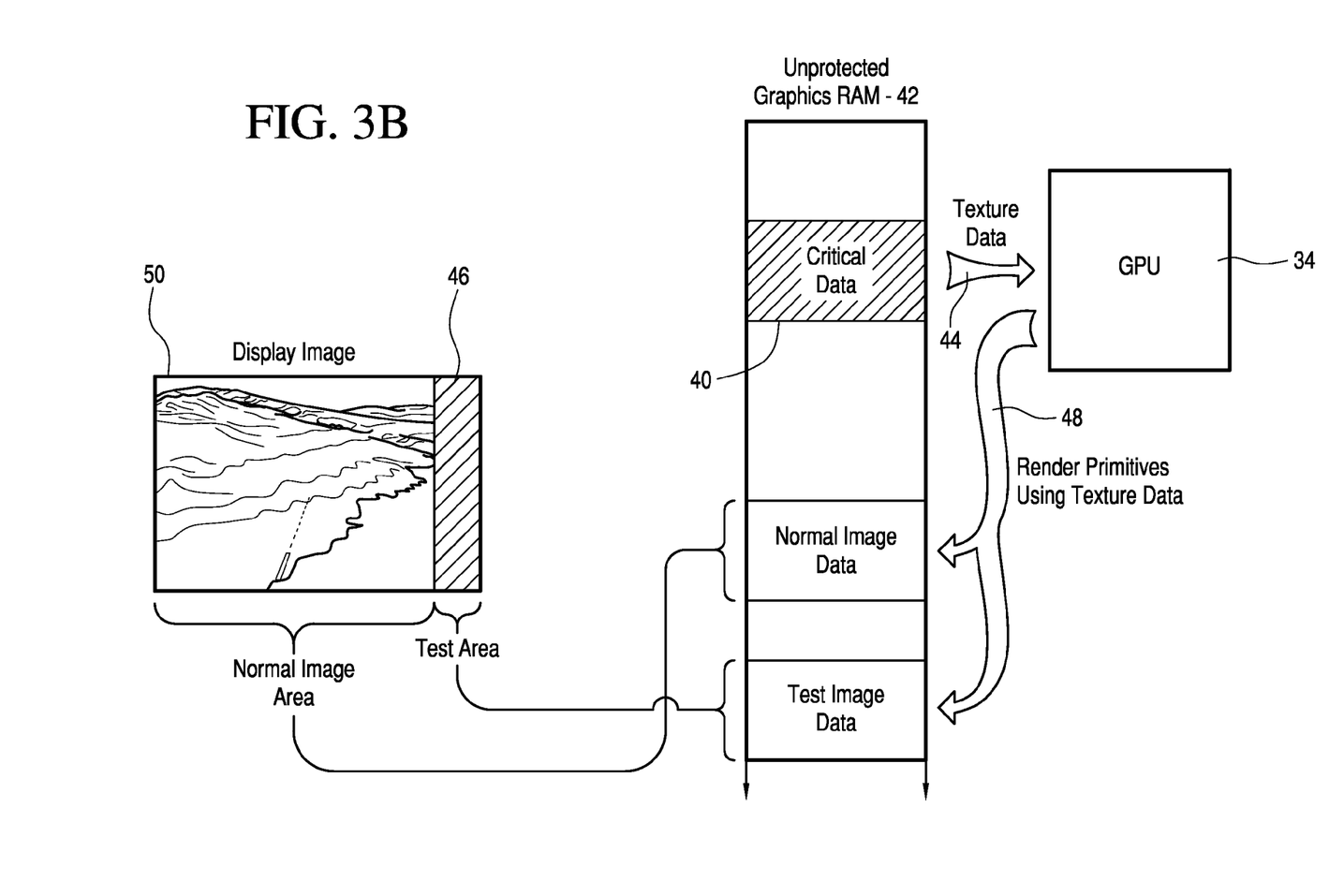
Figure 3C:
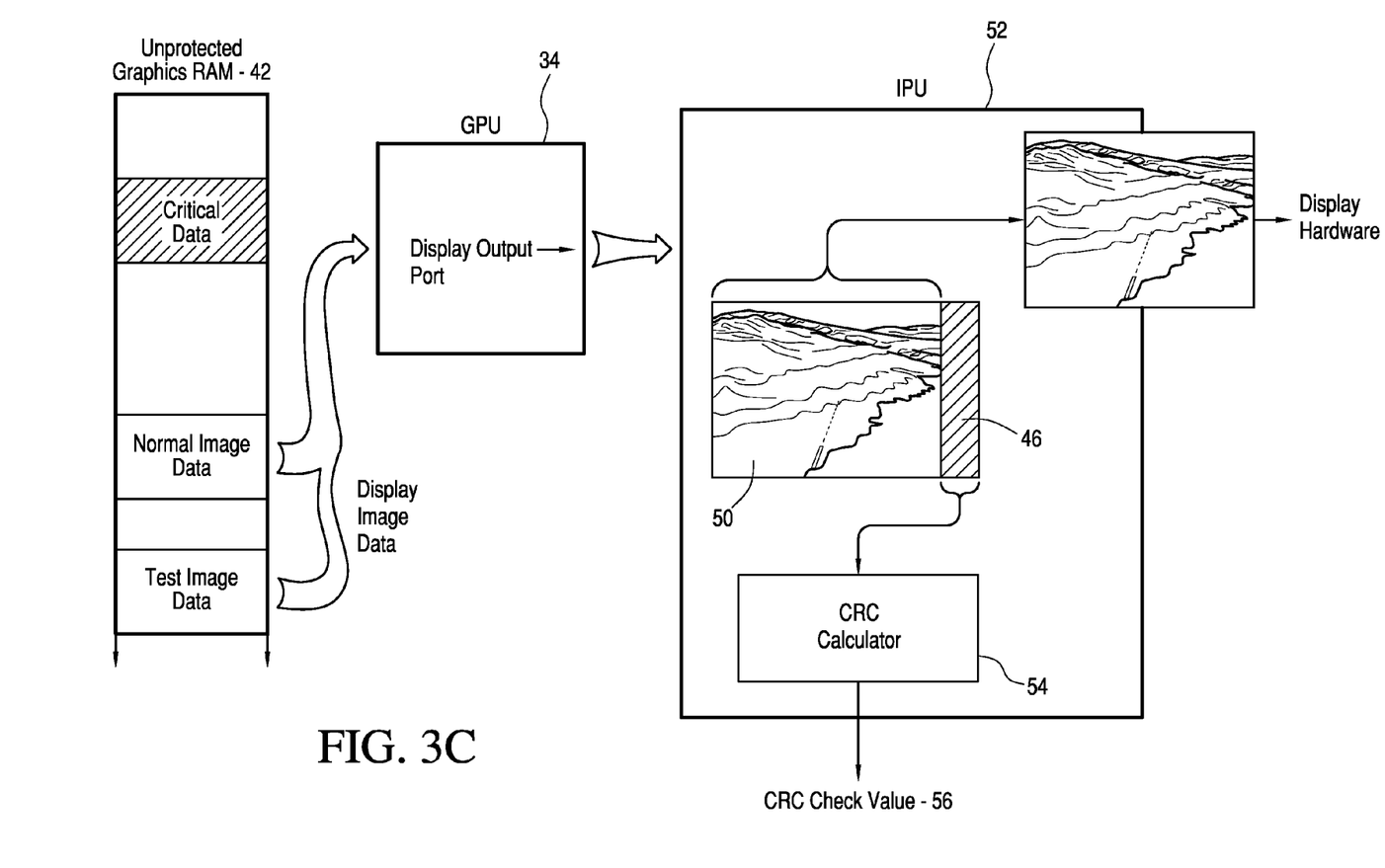

Referring now to FIGS. 3A-3C, the sequence of operations is illustrated. As shown in FIG. 3A, critical data 40 is placed in an unprotected random access memory (RAM) 42 of the GPU 34.

As shown in FIG. 3B, the GPU 34 is instructed by the CPU to use a portion of the unprotected GPU RAM 42 where critical data is stored as texture image data. The loaded shader program will use the texture image data when drawing primitives (see arrow 44). The GPU 34 is instructed to render at least one primitive using the texture image data into a test area 46 of the GPU RAM (see arrows 48). The primitive being rendered is such that each element of the texture image data 44 corresponds to at least one element of a display image data area where the primitive is rendered. The GPU is instructed to combine test image data from the test area with normal image data from a normal image area of a display image to form a composite image 50 for output as display image data. As shown in FIG. 3B, the normal image area is shown adjacent to the test area. However, this does not necessarily need to be the case. The test image area could be any part of the display image or even the entire display image. The test image needs only be in an area of the display image and at a time that the IPU will recognize it and process it.

As shown in FIG. 3C, the display image data in the GPU RAM 42 is output to an image processing unit (IPU) 52. The display image data is processed by the IPU 52. The IPU 52 distinguishes between the normal image data and the test image data The IPU 52 applies a cyclic redundancy check (CRC) algorithm (see process block 54) to the test image data to calculate a check value 56. The check value is compared against a predetermined value for the image that is expected in the test area 46. A fault is reported if the calculated check value does not match the predetermined value.

Figure 4:
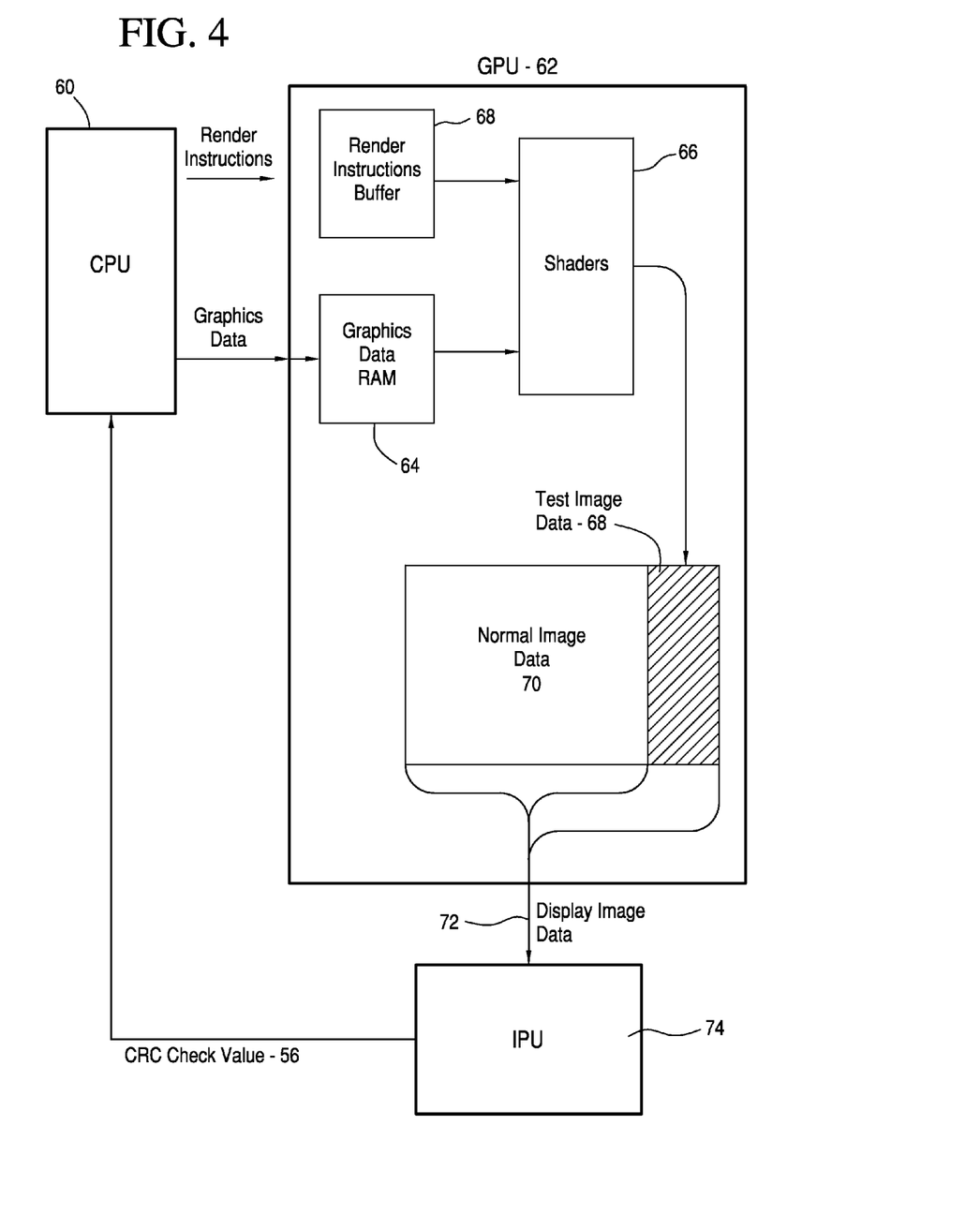
FIG. 4 is a system block diagram of shader processing and control and graphics data to produce on screen and off screen images.

Referring now to FIG. 4, a system block diagram is illustrated showing shader processing and control and graphics data to produce on screen and off screen images. A CPU 60 is configured to instruct a GPU 62 to render a predetermined set of graphic primitives to generate test image data into a test area of random access memory (RAM) 64 of the GPU 62 utilizing at least one of a plurality of shader programs 66 in a list of generated shader programs.

Rendering instructions sent from the CPU 60 are stored in a buffer 68 on the GPU 62. The rendering instructions contain information the GPU 62 needs to execute shader programs to process data in the graphics RAM.

The CPU is configured to instruct the GPU 62 to combine test image data 68 from the test area with normal image data 70 to form a composite image for output as display image data 72.

The GPU 62 is configured to output the display image data 72 in the GPU RAM to the IPU 74, wherein the display image data is processed by the IPU 74. The IPU 74 is configured to apply a cyclic redundancy check (CRC) algorithm to the test image data 68 to calculate a check value.

The CPU 60 is configured to compare the calculated check value against a predetermined value for the test area. The CPU 60 is configured to report a fault if the calculated check value does not match the predetermined value.

It is noted that the present invention has been discussed relative to a representative example of an image produced by a GPU that contains on-screen visible data and off-screen test data. The size of the on-screen and off-screen portions of this image are arbitrary. The image rendered by the GPU, may be, for example, 1424×1050 pixels large. Of these only the left 1400×1050(SXGA+) pixels are actually visible. The final 24 columns (24×1050) are reserved for the rendering of the off-screen image. Each shader used to render image data on-screen is typically used to render test data in the same manner off-screen.

Thus, the application program of the present invention instructs the drawing of image data and certain combinations of shaders are used at various stages of the image pipeline. Each combination provides a unique functionality. Testing of all combinations is generally not feasible due to constraints on CPU/GPU performance and time required. Any error must be detected quickly to ensure misleading information is not displayed for an unacceptable amount of time. The present invention provides a sequence of steps that are executed to ensure proper operation of the shaders in an efficient and responsive manner.

Relative to the aircraft avionics applications, it has been increasingly more difficult to use modern and next generation 3D COTS graphics chips in various avionics companys' embedded designs. Use of 3D COTS graphics chips are required for modern display applications such as Synthetic Vision, 3D map with terrain, etc. It is becoming increasingly less reasonable for companies to produce their own devices to meet this functionality. Traditional graphics devices used in companys' products have fixed functionality pipelines and can only perform the operations built into them. Modern 3D COTS graphics devices are not fixed functionality. Their functionality is loaded at power up and can be different from program to program. The present invention can deterministically assure that the device is working properly. This is particularly important where requirements, design, and test documentation is sparse; and, the devices cannot be trusted to monitor and report internal errors. The present invention ensures proper operation of these programmable graphics devices. It also overcomes a very large roadblock to certifying these parts.

Other embodiments and configurations may be devised without departing from the spirit of the invention and the scope of the appended claims.

The invention claimed is:

1. A method for assuring the proper operation of a programmable graphics processing unit (GPU), comprising the steps of:
   a) generating a list of shader programs;
   b) instructing a programmable GPU to render a predetermined set of graphic primitives to generate test image data into a test area of random access memory (RAM) of said GPU utilizing at least one of said shader programs in said list;
   c) instructing said GPU to combine test image data from said test area with normal image data to form a composite image for output as display image data;
   d) outputting said display image data in said GPU RAM to an image processing unit (IPU), wherein said display image data is processed by said IPU;
   e) utilizing said IPU to apply a cyclic redundancy check (CRC) algorithm to said test image data to calculate a check value;
   f) comparing said calculated check value against a predetermined value for said test area;
   g) reporting a fault if said calculated check value does not match the predetermined value; and,
   h) sequentially repeating steps b)-g) for at least one of shader programs in said list wherein said step of generating a list of shader programs comprises monitoring the operation of said GPU to limit said list of said shader programs to those that have been executed by said GPU.

2. The method of claim 1, wherein said step of rendering a predetermined set of graphic primitives comprises rendering primitives from a group comprising triangles, lines, and points.

3. The method of claim 1, wherein said step of instructing said GPU to render comprises rendering into said test area which is off-screen.

4. A method for assuring the proper operation of a programmable graphics processing unit (GPU), comprising the steps of:
   a) placing critical data in an unprotected random access memory (RAM) of a GPU;
   b) instructing said GPU to use a portion of said unprotected GPU RAM where the critical data is stored as texture image data to be used when drawing primitives;
   c) instructing said GPU to render at least one primitive using said texture image data into a test area of said GPU RAM, said at least one primitive being rendered such that each element of the texture image data corresponds to at least one element of a display image data area where said at least one primitive is rendered;
   d) instructing said GPU to combine test image data from said test area with normal image data from a normal image area of a display image to form a composite image for output as display image data;
   e) outputting said display image data in said GPU RAM to an image processing unit (IPU), wherein said display image data is processed by said IPU;
   f) utilizing said IPU to apply a cyclic redundancy check (CRC) algorithm to said test image data to calculate a check value;
   g) comparing said calculated check value against a predetermined value for said test area;
   h) reporting a fault if said calculated check value does not match the predetermined value; and,
   i) sequentially repeating steps a)-h) for each portion of said critical data to be compared for faults.

5. The method of claim 4, wherein said step of placing critical data comprises the step of placing an address translation table.

6. The method of claim 4, wherein said step of placing critical data comprises the step of placing shader program data.

7. The method of claim 4, wherein said step of placing critical data comprises the step of placing shader program control data.

8. The method of claim 4, wherein said step of rendering a primitive comprises rendering a primitive comprising a triangle, line, and/or point.

9. The method of claim 4, wherein said step of instructing said GPU to render comprises rendering into said test area which is offscreen.

10. The method of claim 4, wherein said IPU processes said display image data by removing said test image data from said display image data and calculating said check value on said test image data.

11. A system for assuring the proper operation of a programmable graphics processing unit (GPU), comprising:
   a) a central processing unit (CPU);
   b) a programmable graphics processing unit (GPU) operatively connected to said CPU;
   c) an image processing unit (IPU) operatively connected to said GPU; and,
   d) unprotected random access memory (RAM) operatively connected to said GPU, wherein,
      i. said CPU is configured to instruct said GPU to render a predetermined set of graphic primitives to generate test image data into a test area of random access memory (RAM) of said GPU utilizing at least one of a plurality of shader programs in a list of generated shader programs;

ii. said CPU is configured to instruct said GPU to combine test image data from said test area with normal image data to form a composite image for output as display image data;
iii. said GPU is configured to output said display image data in said GPU RAM to said IPU, wherein said display image data is processed by said IPU;
iv. said IPU is configured to apply a cyclic redundancy check (CRC) algorithm to said test image data to calculate a check value;
v. said CPU is configured to compare said calculated check value against a predetermined value for said test area; and,
vi. said CPU is configured to report a fault if said calculated check value does not match the predetermined value wherein said CPU monitors the operation of said GPU to limit said list of said shader programs to those that have been executed by said GPU.

12. The system of claim 11, wherein said predetermined set of graphic primitives comprises primitives from a group comprising triangles, lines, and points.

13. The system of claim 11, wherein said test area is off-screen.

* * * * *